US008829926B2

(12) United States Patent
Zachut et al.

(10) Patent No.: US 8,829,926 B2
(45) Date of Patent: Sep. 9, 2014

(54) TRANSPARENT PROXIMITY SENSOR

(71) Applicant: ZRRO Technologies (2009) Ltd., Tel Aviv (IL)

(72) Inventors: Rafi Zachut, Rishon Le'zion (IL); Ori Rimon, Tel Aviv (IL)

(73) Assignee: ZRRO Technologies (2009) Ltd., Tel Aviv (IL)

( * ) Notice: Subject to any disclaimer, the term of this patent is extended or adjusted under 35 U.S.C. 154(b) by 0 days.

(21) Appl. No.: 13/845,472

(22) Filed: Mar. 18, 2013

(65) Prior Publication Data

US 2014/0139239 A1 May 22, 2014

Related U.S. Application Data

(60) Provisional application No. 61/728,016, filed on Nov. 19, 2012.

(51) Int. Cl.
*G01R 27/26* (2006.01)

(52) U.S. Cl.
CPC .................................. *G01R 27/2605* (2013.01)
USPC ........... 324/658; 324/661; 324/679; 345/173; 345/174; 345/178

(58) Field of Classification Search
USPC .................... 324/658, 661, 679; 345/173–178
See application file for complete search history.

(56) References Cited

U.S. PATENT DOCUMENTS

| | | | | |
|---|---|---|---|---|
| 3,974,332 | A * | 8/1976 | Abe et al. .................... | 178/18.08 |
| 4,194,083 | A * | 3/1980 | Abe et al. .................... | 178/18.06 |
| 7,663,607 | B2 * | 2/2010 | Hotelling et al. .............. | 345/173 |
| 7,866,337 | B2 * | 1/2011 | Chinnock et al. .......... | 137/487.5 |
| 8,253,692 | B2 * | 8/2012 | Lai ................................. | 345/173 |
| 2005/0030048 | A1 * | 2/2005 | Bolender et al. ............... | 324/661 |
| 2005/0083307 | A1 * | 4/2005 | Aufderheide et al. ........ | 345/173 |
| 2009/0057908 | A1 * | 3/2009 | Daubenspeck et al. ........ | 257/761 |
| 2009/0322352 | A1 * | 12/2009 | Zachut et al. .................. | 324/658 |
| 2010/0245283 | A1 * | 9/2010 | Lee et al. ........................ | 345/174 |
| 2011/0209287 | A1 * | 9/2011 | Call et al. ............................ | 5/658 |
| 2011/0279397 | A1 | 11/2011 | Rimon et al. | |
| 2012/0081331 | A1 * | 4/2012 | Chae et al. ..................... | 345/174 |
| 2013/0134996 | A1 * | 5/2013 | Burberry et al. .............. | 324/679 |

FOREIGN PATENT DOCUMENTS

WO 2010/084498 A1 7/2010

* cited by examiner

*Primary Examiner* — Tung X Nguyen
*Assistant Examiner* — Giovanni Astacio-Oquendo
(74) *Attorney, Agent, or Firm* — Browdy and Neimark, PLLC

(57) ABSTRACT

A sensing surface is presented for use in monitoring a three dimensional behavior of one or more objects above the surface. The sensing surface is associated with a self-capacitance sensor and comprises a plurality of self-capacitive sensing pads located on a single layer. The sensing surface is configured for providing measured data indicative of a three-dimensional behavior of one or more objects over an active area of the sensing surface. The pattern of the pads is configured such that each sensing pad can be connected to an edge of the sensing surface on said single layer. The technique further enables the use of a capacitive sensor comprising the sensing surface.

13 Claims, 11 Drawing Sheets

TRANSPARENT PROXIMITY SENSOR

TECHNOLOGICAL FIELD

The present invention is in the field of sensing, and more particularly relates to capacitive proximity sensors for sensing a position of an object and generating data relating to the position of the object.

BACKGROUND

Touch screens are commonly used in electronic devices such as computers, laptops, desktops, tablets, televisions, and cellular phones, to enable a user to control the devices by moving the user's finger or a stylus near or on the touch screen. For this purpose, a touch screen may be superposed with a transparent capacitive sensor matrix which senses the user's finger or stylus and generates data relating to the position of the object. This data is analyzed by a monitoring module and is fed to the electronic device, where a cursor could be created for tracking the object's motion, and certain gestures by the user are converted to instructions (for example, for manipulating an object). Capacitive sensors are usually divided into mutual-capacitance sensors and self-capacitance sensors.

Mutual capacitance is capacitance that occurs between two charge-holding objects or conductors, in which the current passing through one passes over into the other. The current between the two objects decreases when a third object is brought toward the first two objects. A mutual-capacitive sensor uses this fact to sense when and where a user's finger or conductive stylus touches the sensor. A mutual-capacitive sensor known in the art generally includes a grid formed by two perpendicular groups of strips (lines) of conductive material. Each group is composed by a respective number of parallel lines. A capacitor is present at each intersection between lines. A voltage is applied in a sequential fashion to the vertical lines of the grid, and an output voltage is measured on the horizontal (measurement) lines. Bringing a finger or conductive stylus near the surface of the sensor changes the local electric field which reduces the mutual capacitance effect. The capacitance change at every individual intersection on the grid can be measured to accurately determine the touch location by measuring the voltage in the rows of the grid. Mutual capacitance allows multi-touch operation where multiple fingers, palms or styli can be accurately tracked at the same time.

Self-capacitance requires only one electrode which holds a "floating capacitance". The floating capacitance is influenced by parasitic capacitance between the electrode and surrounding electric conductors. Since the human body is a conductor, when a finger is placed close to the electrode, the value of the floating capacitance increases and can thereby be detected through a measurement terminal. Self-capacitance sensors can have the same X-Y grid as mutual capacitance sensors, but the columns and rows operate independently. With self-capacitance, a voltage drop is indicative of the capacitive load of a finger on each column or row located near the finger. This produces a stronger signal than mutual capacitance sensing, but the X-Y grid self-capacitance sensor is unable to resolve accurately more than one finger or conductive stylus at a given time.

Another type of a self-capacitance sensor is described in patent publications WO 2010/084498 and US 2011/0279397, which share the inventors and the assignee of the present patent application. In the self-capacitance sensor described in the above-mentioned applications, a two dimensional array (a matrix) of pads is provided to sense the change in the electric field induced by a finger or conductive stylus on each pad, thus enabling multi-touch operation.

GENERAL DESCRIPTION

The present invention is aimed at providing a novel type of capacitive sensor which (i) can be made of a substantially transparent material, and (ii) enables multi-touch and hover operation in three-dimensions i.e. provides sensing signals which allow for multiple objects (e.g., finger or conductive stylus) position calculation even while at least some of (or all) the objects hover above the sensor and optionally some of the other objects touch it.

The capacitive sensor can be overlaid on top of an active display device like an LCD screen to sense finger position (X/Y position) and height (Z) over the display. It should be noted that the transparency of the material enables the underlying surface to be viewed through the sensor.

A mutual capacitance sensor, as described above, is generally incapable of sensing with high resolution the location of a hovering object. This is because the measured voltage drop in response to a hovering object could be one-hundredth of the voltage measured in response to a touching object which is already weak comparing to the voltage drop sensed in the self-capacitance method. Moreover, the influence of a touching finger on the measurement line it touches could be greater than a hovering finger on a different position on the same line. Also, mutual capacitance is more sensitive to noise as the noise injected by the finger might create phantom fingers all over the measurement line.

Thus, a mutual-capacitance sensor may provide multi-touch operation, but is not suitable to operate as a three-dimensional sensor. As described above, in self-capacitance sensor having an X-Y grid, it is possible to identify a hovering finger, due to the stronger signal strength. However, as mentioned above, the self-capacitance sensor is unable to resolve accurately the position of more than one object at a given time. Self-capacitance sensor having a two dimensional array of pads, as described in WO 2010/084498 and US 2011/0279397, can operate as both a multi-touch sensor and as a three-dimensional sensor. However, this sensor is made of non-transparent material.

There is therefore a need for a novel capacitive sensing surface which can be made of transparent material, while maintaining the capability to operate as both a multi-touch and three-dimensional sensor.

The present invention addresses this need and relates to a sensing surface having an active area defined by a pattern of spaced apart self-capacitance sensing pads arranged on a single layer/plane. The active area may be defined as the area over which objects can be tracked. The pads are arranged such that, each sensing pad is configured for being connected to an edge of the sensing surface on the single layer.

The electrical connection between each sensing pad of the pattern and an edge of the sensing surface is located in the layer of the sensing pads. In the case in which each pad has a contact area with the surface edge, the electrical connection may be made by the direct contact of each pad with the surface's edge. Alternatively, at least one of the pads is connected to the edge of the surface via a respective wire (electric trace) passing over the active area, the wire and the pad being coplanar (arranged on the same layer).

In the latter case, a shielding layer is to be placed over the wires to protect the signals propagating through the wires so that the object-wire self-capacitance effect will be negligible. As will be shown in the detailed description, one advantage of this sensing surface lies in the fact that the wires and pads are coplanar, thus reducing the number of layers of the capacitive sensor of the present invention, (as compared to the sensors of other embodiments, where the wires are located on a dedicated layer).

It is possible to make self-capacitive sensor matrices which are implemented on PCBs using conductive holes (generally called "vias") to connect the pads to the corresponding wires (which lie on a different layer). In the present invention, the wires are coplanar to the pads. Thus, the number of layers included in the sensing surface is reduced and the need for vias is obviated.

Thus, according to an aspect of some embodiments of the present invention, there is provided a sensing surface associated with a self-capacitance sensor. The sensing surface comprises a plurality of self-capacitive sensing pads located on a single layer, the sensing pads being configured for providing measured data indicative of a three-dimensional behavior of one or more objects over an active area of the sensing surface. It should be understood that three-dimensional behavior may comprise at least one of the following: a three dimensional position of the one or more objects with respect to the sensing surface; a change in position of the one or more objects with respect to the sensing surface; a motion pattern of the one or more objects with respect to the sensing surface.

The active area of the sensing surface is defined by a pattern of the pads on the single layer. In one embodiment, the active area is the area surrounding the pads. The pattern of the pads is configured such that the connection of each sensing pad to an edge of the sensing surface is located on the single layer of the pads.

In a variant, the pads are made of a transparent material.

In another variant, the sensing surface is configured for detecting the one or more objects when the one or more objects touch the sensing surface and/or when the one or more objects hover above the sensing surface.

In yet another variant, the sensing surface comprises a lower shielding layer located under the pads layer and isolated from the pads layer, the lower shielding layer being patterned to cover the active area, and being configured for shielding the active area from self-capacitance effects that may be caused by the proximity of the one or more elements located under the sensing surface.

In a further variant, at least one of the pads is connected to the edge via a respective wire passing over the active area, the wire and the pad being coplanar.

In yet a further variant, the sensing surface comprises an upper shielding layer overlaying the surface and isolated from the pads and wires, the upper shielding layer being patterned to cover all wires, while leaving the pads exposed, the shielding layer being configured for shielding the wires from self-capacitance effects that may be caused by the proximity of the one or more objects to the wires.

Optionally, at least one of the wires and the shielding layer are made of a transparent material.

In a variant, the pattern comprises an arrangement of spaced-apart pads such that at least two spaced-apart pads flank a pad-less region, the pad-less region being a region without pad or a region through which one or more wires pass.

In another variant, wherein the pads are arranged in groups, each pad belonging to one of the groups having a geometrical shape chosen such that the pads of the groups form a desired shaped perimeter.

In yet another variant, the pattern is a checkered pattern.

In a further variant, the pads are arranged in spaced-apart parallel lines, and the wires are located in the spacings between the vertical lines.

In yet a further variant each pad touches (i.e. directly contacts) the edge.

Another aspect of some embodiments of the present invention relate to a capacitive sensor comprising the above-defined sensing surface, and configured for detecting a three-dimensional behavior of one or more objects.

According to another aspect of some embodiments of the present invention, there is provided a self-capacitance sensor system comprising: one or more self-capacitive sensing pads arranged on a single layer, each sensing pad being configured for providing measurement indicative of the three-dimensional position of at least one object with respect to the sensing pad; at least two of the pads flank a pad-less region between them through which one or more wires pass, the wires connected to pads and adapted for conducting electric signals to and from the sensing pads; and wherein one or more conductive elements are arranged along a layer located above the first layer of the pads and wires and isolated from the pads and wires to form an upper shielding layer electrically insulated from the pads and the wires layer; and wherein the conductive elements of the upper shielding layer are configured to cover the wires while leaving the pads exposed, thereby shielding the wires from self-capacitance effects that may be caused by the proximity of the one or more objects to the wires.

In some embodiments, the conductive elements of the upper shielding layer are made of a transparent material.

In some embodiments, at least some of the wires are formed with a transparent conductive material.

In some embodiments, the self-capacitance sensor system is configured and operable for providing a measurement indicative of the distance of the at least one object to the sensing pad when the at least one object hovers and/or touches the self-capacitance sensor.

In some embodiments, a voltage measured on one end of a wire is indicative of a distance between the object and the sensing pad which is connected to the other end of the wire.

In some embodiments, substantially during the measurement corresponds to a certain pad, the potential of the conductive elements of the upper shielding layer covering the wire connected to the pad is maintained to be substantially the same as the potential of the wire, thus minimizing the parasitic capacitance effect between the wire and the conductive element on the voltage measurement, and therefore increases signal-to-noise ratio (SNR) of the measurement which allows for a detection of a hovering object from a greater distance from the pad.

In some embodiments, the self-capacitance sensor system comprises at least one amplifier electrically connectable in between a conductive element of the upper shielding layer covering a wire and the wire to maintain the potential of the conductive element substantially the same as the potential of the wire.

In some embodiments, the amplifier is electrically connected to a wire via a high impedance input of the amplifier and electrically connected to a conductive element of the upper shielding layer via a low impedance output of the amplifier.

In some embodiments, the input of an amplifier is electrically connected to one or more wires via analog switch; the switch connects between one wire and the input of the amplifier at a given time.

In some embodiments, the amplifier comprises a unity gain buffer or near unity gain buffer configured and operable substantially as a voltage follower, thereby capable to maintain the potential of a conductive element of the upper shielding layer connected to its output substantially the same as the potential of the wire covered by the conductive element.

In some embodiments, the sensing pads are made of a transparent material.

In some embodiments, the sensing surface further comprises a lower shielding layer located under the pads and wires layer and isolated from the pads and wires layer, the lower shielding layer comprises conductive elements arranged to cover the pads and wires, and being configured for shielding the pads and wire from the self-capacitance effects that may be caused by the proximity of elements located under the sensing surface.

In some embodiments, substantially during the measurement corresponds to a certain pad, the potential of a conductive elements of the lower shielding layer which shield the pad and the wire which is connected to the pad, is maintained to be substantially the same as the potential of the pad and the wire in order to minimize the parasitic capacitance effect between the conductive elements and the pad and the parasitic capacitance effect between the conductive elements and the wire connected to the pad, on the measurement.

In some embodiments, an amplifier is electrically connected to a wire via a high impedance input of the amplifier and electrically connected to a conductive element of the lower shielding layer via a low impedance output of the amplifier.

In some embodiments, the input of an amplifier is electrically connected to one or more wires and/or pads via analog switch; the switch connects between one wire or pad and the input of the amplifier at a given time.

In some embodiments, the amplifier comprises a unity gain buffer or near unity gain buffer configured and operable substantially as a voltage follower, thereby capable to maintain the potential of a conductive element of the lower shielding layer connected to its output substantially the same as the potential of a wire or a pad which are covered by the conductive element.

In some embodiments, a predetermined potential is applied to at least one of the lower shielding layer and the upper shielding layer.

In other embodiments, an adaptive potential is applied to at least one of the lower shielding layer and the upper shielding layer.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Figure 1A:
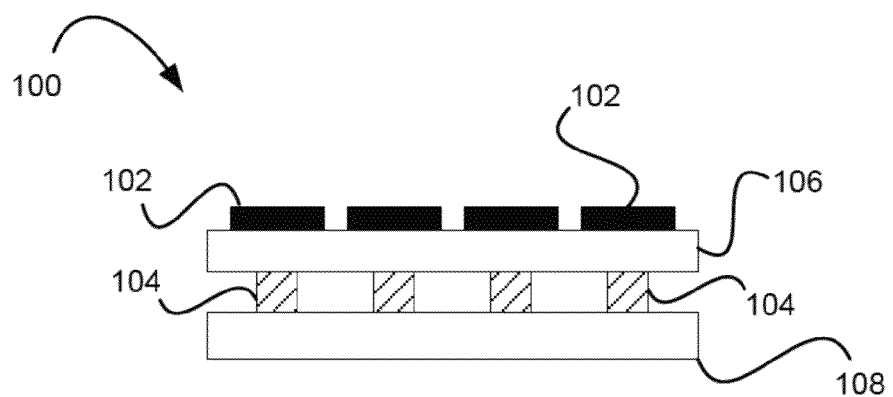
FIGS. 1a-1b are schematic drawings illustrating a possible implementation of a self-capacitance sensor having a sensing surface defined by a two dimensional array of pads, as which two dimensional arrays are known in the art.
Figure 1B:
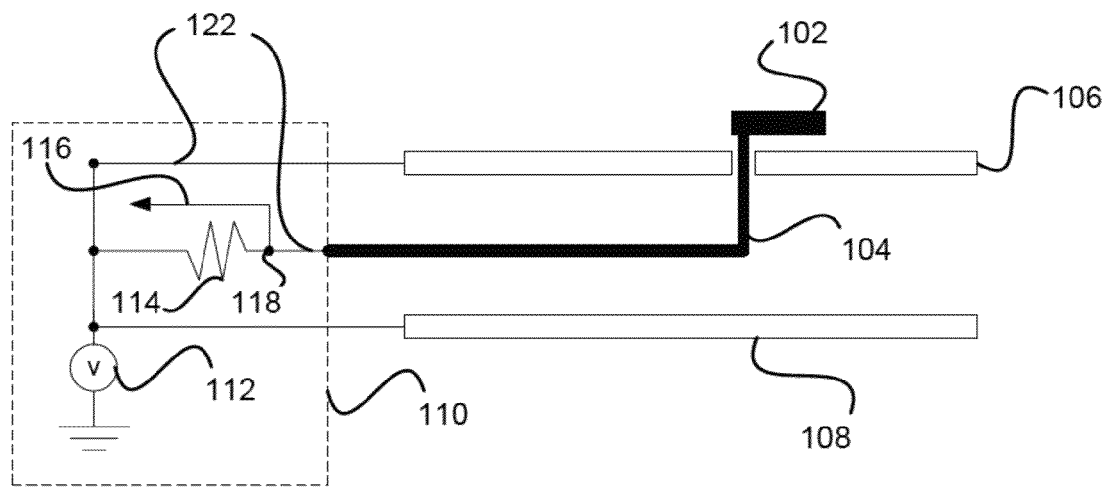

FIGS. 1a-1b are schematic drawings illustrating an example of a self-capacitance sensor 100 having a sensing surface defined by a two dimensional array (matrix) of pads, which two dimensional arrays are known in the art. FIG. 1a illustrates a side cross section of the sensor's sensing surface. FIG. 1b illustrates the electric connections between a pad and an electric circuit exciting the pad, and the measurement of a voltage drop in the electric circuit.

The sensor 100 includes a plurality of conductive pads (generally 102) located on a single layer. Each pad is connected via a respective conductive wire (generally 104) to an electric circuit 110 and a measurement unit (not pictured).

The electric circuit includes an excitation source 112, and a serial resistor 114, and is connected to the measurement unit via a second wire 116 connected to the junction 118, downstream of the resistor. The excitation source 112 is configured for generating an input signal to be transmitted to the pad 102.

It should be understood that, generally in self-capacitance sensors as known in the art, when an object approaches the pad, a voltage drop occurs in the output signal that is transmitted from the pad to a measurement unit via the second wire 116, due to the self-capacitance effect between the finger and the pad and due to the presence of a resistor present in the electric circuit exciting the pad. This is because the object and the pad form together a plate capacitor. The closer the object is to the pad, the greater this capacitance is and the higher the increase in the voltage drop. Thus, the voltage drop in the electric circuit can be used to estimate a distance between the object and the pad. The measurement unit receives the output signals from the plurality of pads and generates data indicative of the position of the object with respect to a sensing surface. Optionally, a single electric circuit is used for transmitting the input (and output) signal to (and from) each pad sequentially (e.g., via a switching device). Alternatively, each pad is connected to a respective electric circuit. The electric circuit and the measurement unit may be included on a single chip.

The wires should be shielded by an upper shielding layer 106 and a lower shielding layer 108. The shielding layers shield the wires from the self-capacitance effects which may be created between the object and the wires. The shielding of the wires is required in order to receive a capacitive image from the sensor which is composed of measurements which are effected almost solely by the self-capacitance effect between the one or more objects and the sensing pads. Self-capacitance effect on unshielded wire will affect the measurement which will be associated with the pad during the analysis stage of the image. Therefore, without shielding, the received image would be unreliable (i.e., the received image will not be solely indicative of the influence of the one or more objects above the sensor on the pads but also would be affected by the self-capacitance associated with the wires). The requirement from the shielding layer is that the potential of the shielding layer will not be influenced by one or more objects above or below the wire. Otherwise, the influence of the parasitic capacitance between the wire and shielding layer on the measurement will not be predictable. Optionally, the shielding layers are alternating current (AC) shields. In such case the excitation source of the shielding layer should be strong enough to maintain a shielding potential which is independent of load from one or more objects above the shield. In this case, the excitation source 112 of the electric circuit, or an AC source generating the same signal as the excitation source 112 excite a top alternating current (AC) shield plate 106 and a bottom AC shield plate 108 enclosing the wires 104. The proximity of an object to the AC shield facing the object creates a capacitance between the AC shield and the object. However, this does not affect the electric potential along the AC shield, since a resistance of the leads supplying power to the AC shield and of the AC shield itself is negligible compared to the resistance of the resistor 114. Thus, the difference in potential between any AC shield and the wire is substantially very small, notwithstanding the presence of the object above the wire. Therefore, the (parasitic) capacitance created between any AC shield and the wire 104 is also negligible, and the signals to and from the pad traveling through the wire 104 are not affected by the proximity of the object to wire 104.

It should be noted that the term "wires" generally refers to the conductive elements located on the active area (i.e., the region in which the object is to be detected) of sensing surface itself. The wires are configured for conducting signals to and from the pads. The term "leads" generally refers to conductive elements configured for conducting the same signals. However, such elements are located outside the active area of the sensing surface. The leads and wires connect each other at the border of the active area of the sensing surface.

The presence of the AC shields is required because, while the outer pads (i.e., the pads touching the edge of the sensing surface) touch the borders of the sensing surface and can be easily connected to the electric circuit(s), the inner pads are located away from the borders. Therefore, the wires 104 must be traced between the inner pads and the borders of the sensing surface. Moreover, in order to improve the resolution of the sensor and fit many pads in a given surface, the pads 112 are arranged as close as possible to each other. Thus, the wires 104 are to be located under the pads, between the top and bottom AC shields.

It should be noted that the AC shield is only one example of a shielding layer. Instead of the AC shield, in which the conductive shielding layers are excited by an alternating current, the conductive shielding layers may be grounded, as known in the art. As long as the conductive shielding layers' potential is not affected by one or more objects above them, the wire will be shielded. However, it can be shown that when using an AC shield, the parasitic capacitance between wire 104 and shielding layers 106 and 108 and the parasitic capacitance between the bottom side of pad 102 and the shielding layer 106 will attenuate the pad-finger self-capacitance effect measured at junction 118 much less as compared to the grounding of the conductive shielding layer or to the use of a direct current (DC) source to excite the shielding layers.

When the layers of the self-capacitance sensor of this embodiment are implemented on a PCB (printed circuit board), "vias" enable passage of the wires from the pads to the controller, while maintaining the shielding layers' capability to shield the wires. This PCB structure, however, cannot be made from a transparent material since industrial vias technology through known transparent conductive materials is not known in the current state of the art. Moreover, another difficulty in making a transparent sensor having multiple stacked transparent layers lies in the fact that each layer reduces transparency.

It should be understood that the electric circuit connected to the sensing surface 100 is an example of a basic electric circuit which illustrates the operation of a capacitive sensor. Other electric circuits, with additional elements (e.g., resistors, amplifiers, etc.) are known in the art, and may be used as part of a capacitive sensor.

Figure 2:
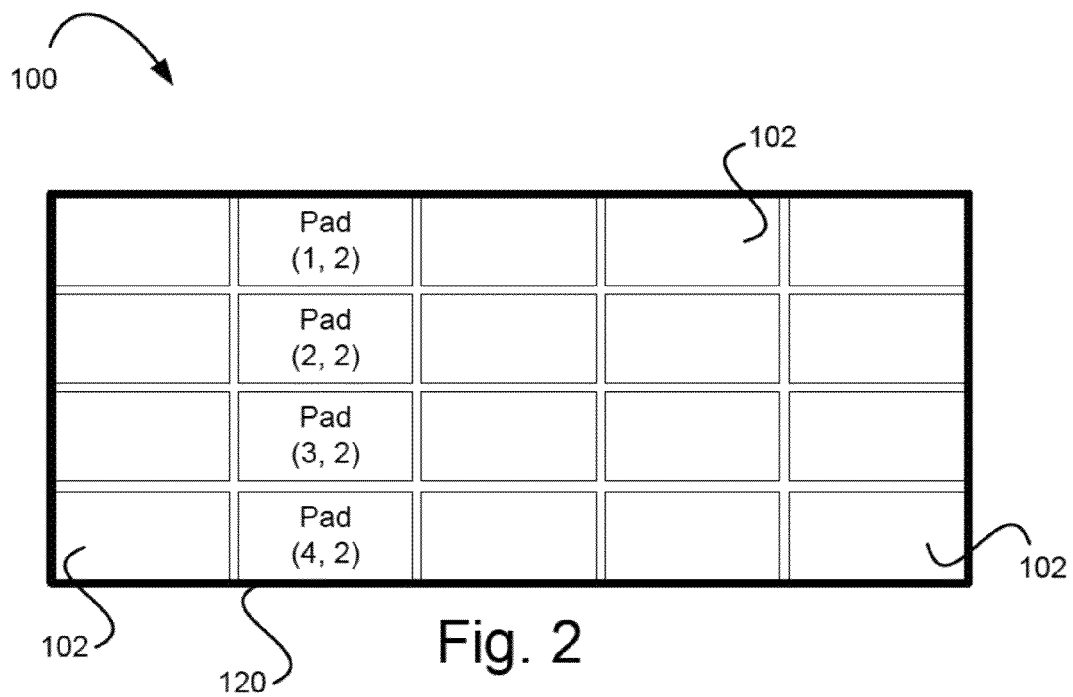
FIG. 2 is a schematic drawing illustrating a top view of a sensing surface known in the art, having rectangular pads.

FIG. 2 is a schematic drawing illustrating a top view of a sensing surface 100 having rectangular pads, which pattern is known in the art. The sensing surface 100 is made of four rows of pads, and may have any number of columns. In the embodiment of the present invention shown in FIGS. 1a, 1b and 2, the area of the sensing surface is enclosed by an edge 120. At the edge 120, the pads or wires connected thereto are joined to leads conducting to the measurement unit and electric circuit. It can be seen that the inner pads (2, 2) and (3, 2) do not touch the edge 120, and thus are to be connected to the leads via wires travelling on a dedicated layer between two shielding layers, as shown above in FIGS. 1a-1b. As explained above, this connection does not allow the sensing surface to be made of transparent material.

Referring now to the drawings, FIGS. 3-7 relate to some embodiments of the present invention, in which all self-capacitance pads are in direct contact with the border of the sensitive surface (e.g., each pad has a point on the pad's perimeter which touches the edge of the sensing surface). In these embodiments, the need for an upper shielding layer is obviated by the novel configuration of the sensing surface, and the sensing surface includes a first layer on which the pads are printed, and optionally a lower second layer to be placed under the first layer as shield from the underlying liquid-crystal display (LCD).

Figure 3A:
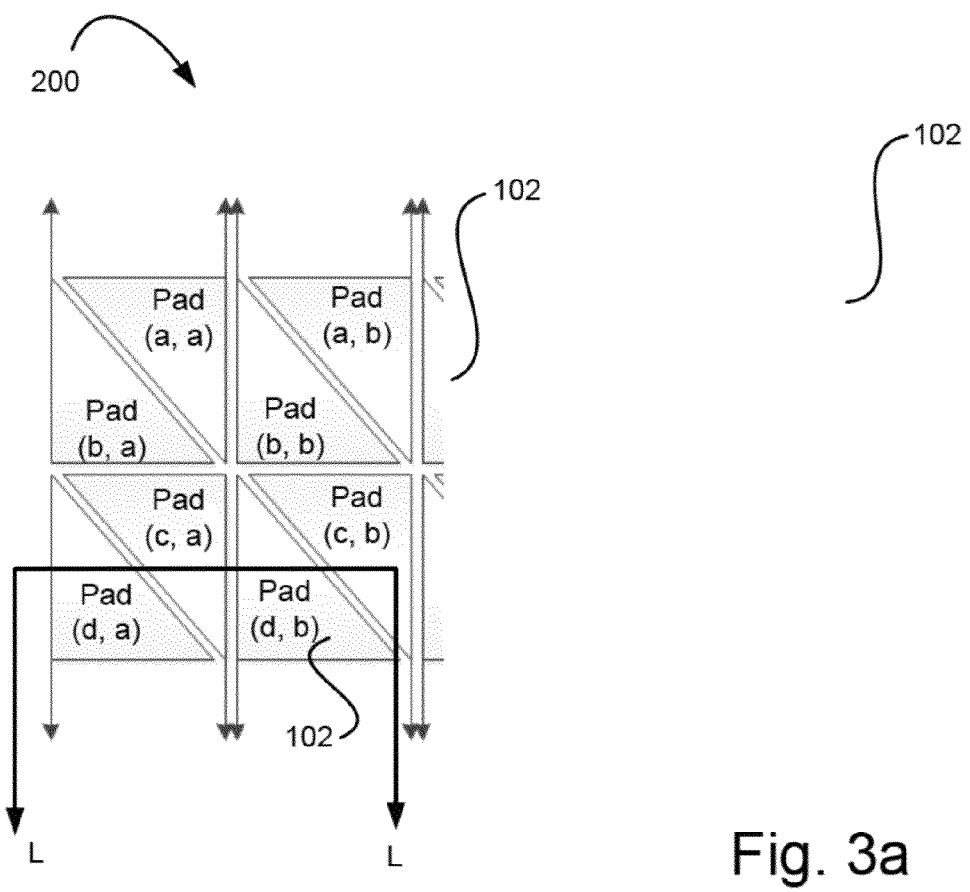
FIGS. 3a-3c illustrate examples of a pattern and geometries of the pads that can be used in a sensing surface of the present invention, in which all pads contact a border of the sensing surface.

An example of the novel configuration of the sensing surface is illustrated in FIG. 3a, where a sensing surface 200 of the present invention is shown, in which all pads contact/touch a border of the sensing surface.

As was the case with the pads of the sensing surface 100 of FIG. 2, the pads of the sensing surface 200 are coplanar (arranged on a single layer) and spaced apart from each other. In the sensing surface 200, the novel configuration of the sensing surface comprises a novel geometry of the pads and/or a novel pattern of the pads in which the pads are arranged such that all pads (generally 102) contact the border of the sensing surface. The sensing surface 200 can be used as part of a touch/proximity sensor on small screens having a diagonal of about 4 inches of cellular phones.

In the example of FIG. 3a, the pads forming the sensing surface 200 are shaped as right-angled triangles. In this specific and non-limiting example, the pads of the sensing surface 200 are arranged so that the hypotenuses of two consecutive right-angled triangles along a horizontal line, facing each other. In this manner, all the pads (a, b), (b, b), (c, b) and (d, b) have at least one edge which is in contact with the edge of the sensing surface 200.

It should be noted that, despite the change in the configuration of the pads, the average sensing desired resolution of the sensing surface 200 is not lowered with respect to that of the sensing surface 100, since on average a given area is covered by the same number of pads for both sensing surfaces.

Because the sensing surface of the present invention does not necessitate the presence of wires passing over the active area, the need to have an upper shielding layer (e.g. AC shield or grounded conductive element) is obviated as well as the need for "vias". Thus, the pads may be made of a transparent material, In some embodiments, the sensor may also comprise a lower shielding layer, in order to shield the pads from objects located under the pads, such as an LCD screen. The lower shielding layer may be transparent as well.

A non-limiting example of a transparent conductive material suitable for forming the pads and the shielding layer may be a transparent conductive oxide (TCOs), such as indium-tin oxide (ITO), fluorine doped tin oxide (FTO), and doped zinc oxide. Another non-limiting example of a suitable transparent conductive material may be an organic film. The organic film may be formed by carbon nanotubes and/or graphene, or may include a polymer, such as poly(3,4-ethylenedioxythiophene) or a derivative thereof.

While the sensing surface 100 of FIG. 2 includes four layers (pads, upper shield, wires, lower shield), the sensing surface 200 of the present invention includes at most two layers (pads, and lower shielding layer, if needed). This will be illustrated in detail in FIGS. 6a-6b below.

Thus, the pattern of the pads of the sensing surface 200 enables the sensing surface 200 to be transparent and to be used in 3D, multi-touch sensor, based on self-capacitance technology as explained above.

Figure 3B:
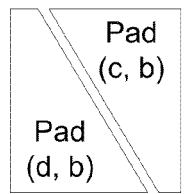
Figure 3C:
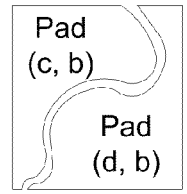

Referring now to FIGS. 3b-3c, non-limiting examples of different pad geometries are illustrated, for use in the sensing surface 200 of FIG. 3a. In FIG. 3a, the pads of the sensing surface were shown to be shaped as right-angled triangles. However, this is not a necessity and the present invention covers any shape which enables all pads to contact the sensing surface's edge.

In the example of FIG. 3b, the pads (c, b) and (d, b) are shaped as right trapezoids facing each other via their respective oblique sides. FIG. 3c is a self-explanatory drawing showing another possible example of a different geometry. Generally, two successive pads may have any shape as long as both form a predefined perimeter (e.g. rectangular, rhomboidal, parallelogram, circular, etc.) and are in contact with the sensing surface's edge. It should be noted that though the present example illustrates a pattern formed by pairs of pads, the present invention is not limited to this example. In fact, the scope of the present invention may include a pattern of pads, in which a desired finite number of pads forms a predefined perimeter. This pattern may repeat itself along the sensing surface.

Figure 4:
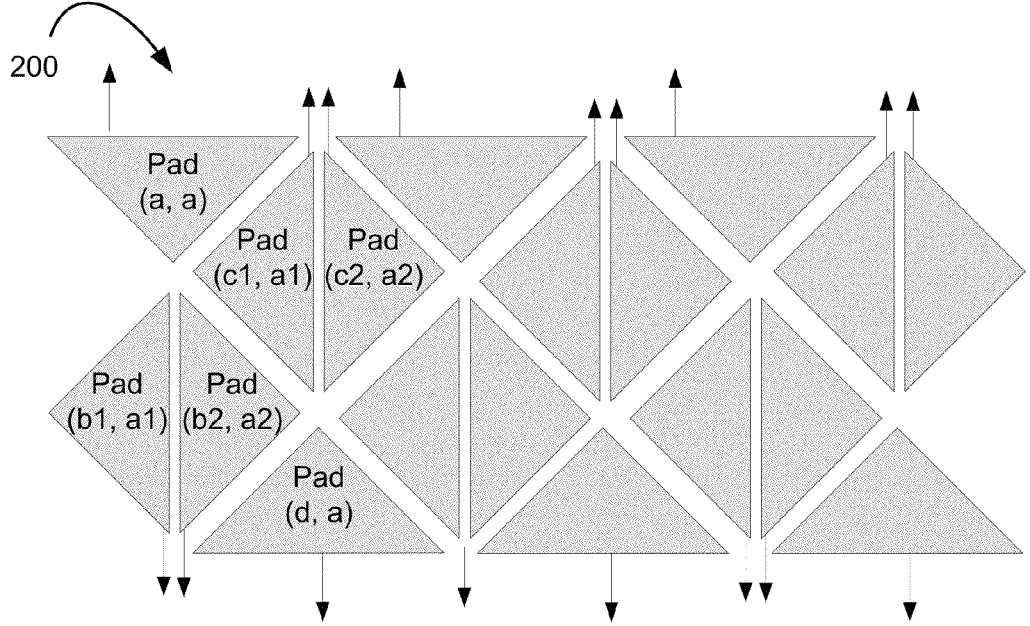
FIG. 4 is a schematic drawing illustrating a top view of a section of a sensing surface of the present invention having triangular pads arranged so that the hypotenuses of the triangles are either vertical or horizontal.

FIG. 4 is a schematic drawing illustrating a top view of a section of a sensing surface 200 of the present invention having triangular pads arranged so that the hypotenuses of the triangles are either vertical or horizontal.

In the example of the present invention illustrated by FIG. 4, the sensing surface 200 includes triangular pads, where all the pads are in contact with the edge of the sensing surface. For example, on a first vertical line, the triangular pad (a, a) is arranged having the hypotenuse disposed horizontally and in contact with the upper edge of the sensing surface, while two triangular pads (b1, a1) and (b2, a2) are in contact with the lower edge of the sensing surface and are arranged having their hypotenuses disposed vertically. On an adjacent vertical line, two triangular pads (c1, a1) and (c2, a2) are contact with the upper edge of the sensing surface and are arranged having their hypotenuses disposed vertically, while the triangular pad (d, a) is arranged having the hypotenuse disposed horizontally and in contact with the lower edge of the sensing surface.

Figure 5:
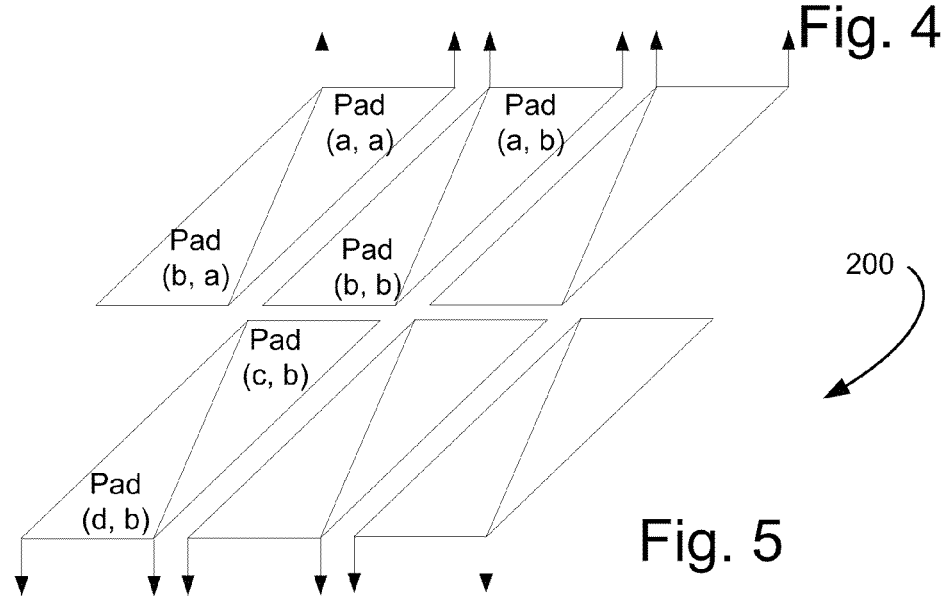
FIG. 5 is a schematic drawing illustrating an example of a pattern of pads and of geometry of the pads that can be used in a sensing surface of the present invention, in which all pads contact a border of the sensing surface.

Referring now to FIG. 5, a schematic drawing illustrates another example of a pattern of pads and of a geometry of the pads that can be used in a sensing surface of the present invention, in which all pads contact a border of the sensing surface.

Figure 6A:
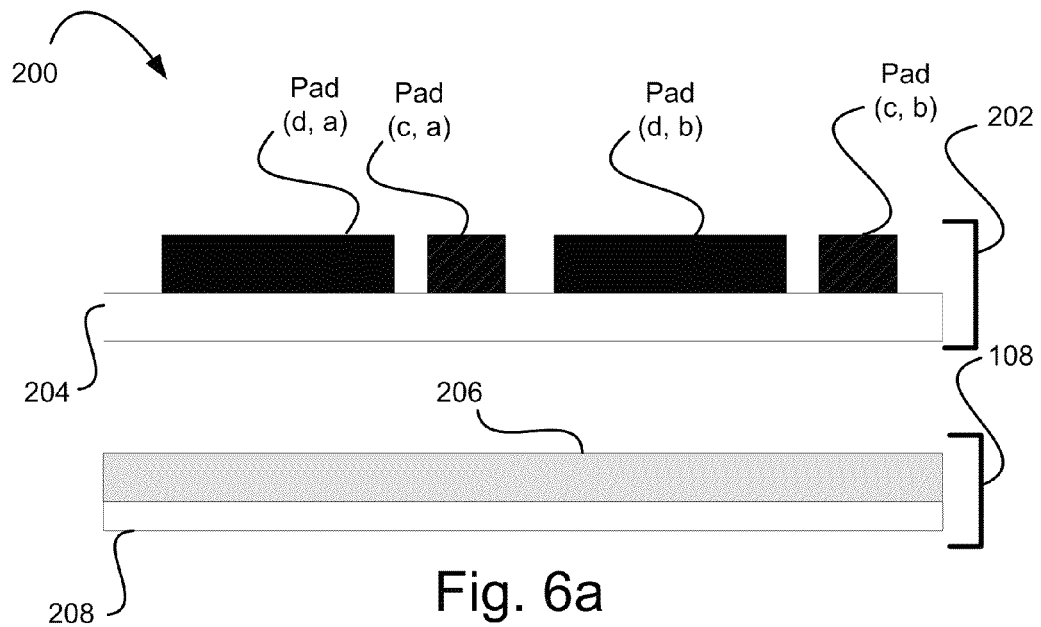
FIGS. 6a-6b are schematic drawings illustrating a lateral cross section of a sensing surface in which all pads contact a border of the sensing surface, according to some embodiments of the present invention.
Figure 6B:
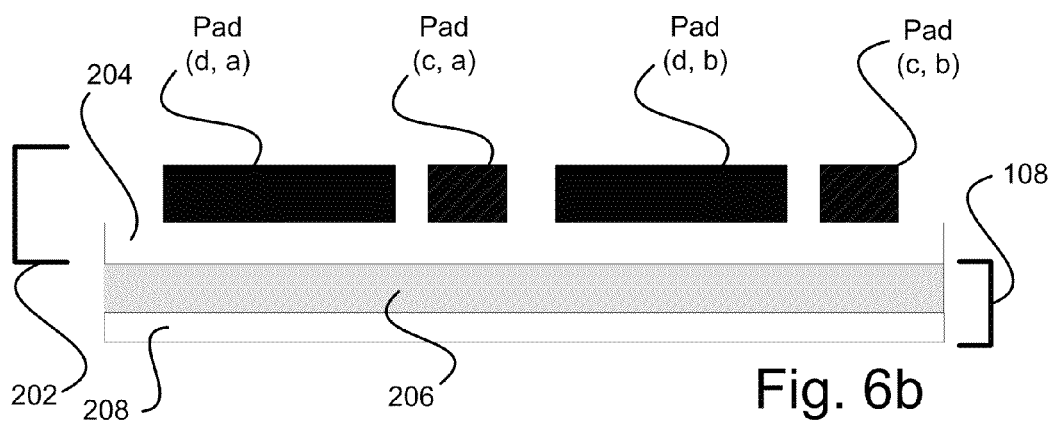

Referring now to FIGS. 6a-6b, there is illustrated a lateral cross section LL of the sensing surface 200 of FIG. 3a, according to some embodiments of the present invention. In FIG. 6a, each layer of the sensing surface 200 is shown separately. In FIG. 6b, the sensing surface is shown in its assembled form.

The sensing surface in the example of FIGS. 6a-6b is the sensing surface 200 of FIG. 3a. However, any sensing surface of the present invention in which all pads contact a border of the sensing surface can have the same structure illustrated in FIGS. 6a-6b.

The pads layer 202 includes the pads (e.g., the pads (d, a), (c, a), (d, b), (c, b)) printed over a first insulating sheet 204. In this connection, it should be noted that the term "print" may refer to any process used in the fabrication of the pattern such as lithography, wet-etching techniques, deposition, etc.

The bottom shielding layer 108 (if present) includes a film of conductive material 206 constituting the shield printed upon a second insulating sheet 208. When the layers 202 and 108 are brought together, the conductive material 206 touches the first insulating sheet 204. In this manner, the pads and the conductive material 206 of the shield layer are insulated from each other.

The bottom shielding layer shields the pads from self-capacitance effect created by one or more objects located underneath the sensor and/or from noise sources located underneath the sensor.

In this connection, it should be understood that when the sensor is overlaid on top of an LCD (which is a large grounded object) without a bottom shielding layer, the parasitic capacitance between the LCD and the pad attenuates the measurement of the self-capacitance effect between the object and the pad. The attenuation is in particular problematic in case of hovering object. This is because the parasitic capacitance could be 100 times bigger than the capacitance between a hovering object and a pad (for example 5 pF parasitic capacitance versus 50 fF of pad-finger capacitance). Therefore the parasitic capacitance dominates the load on the self-capacitance measurement circuit. It can be shown that the use of a bottom shielding layer driven by an AC signal (substantially the same signal as the excitation signal, as explained in reference to FIG. 1b) can help to reduce the attenuation by a factor of 50. This is because the voltage on the parasitic capacitance between the pad and the (AC) shielding layer is small (especially in a hovering finger condition) and therefore the load of the parasitic capacitance reflected to the self-capacitance measurement circuit is also small.

As mentioned above, the pads and conductive film of the shield may be made of any available conductive transparent material. The first and second insulating films may be made of polyester PET film, for example.

It should also be noted that, instead of printing the pads and conductive material 206 on top of their corresponding insulating sheets, the pads and conductive material 206 may be printed on the bottom surfaces of their corresponding insulating sheets.

Figure 7:
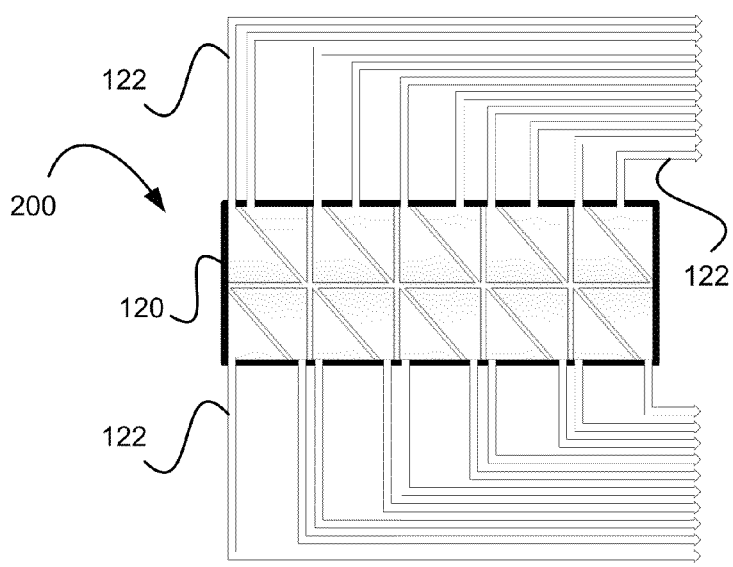
FIG. 7 is a top view of a sensing surface of the present invention, illustrating a sensing surface of the present invention, in which each pad contacts a border of the sensing surface and is connected to a respective outer lead conducting to the electronic device(s) and the measurement unit.

FIG. 7 is a top view of a sensing surface 200 of the present invention, in which each pad contacts a border of the sensing surface and is connected to a respective outer lead conducting to the electronic device(s) and the measurement unit. FIG. 7 clearly shows that in the sensing surface 200, each pad is connected to a respective lead (generally 122) at the edge 120 of the surface. The leads reach the electric circuit, where the output signals change as a function of the input signal transmitted by the excitation source to the pads and the proximity of an object to the pads.

The following figures (FIGS. 8-12) relate to some embodiments of the present invention in which at least some of the self-capacitance pads are connected to the border of the active area (i.e., the region in which the object is detected) (and thus the leads) via respective wires tracing respective paths co-planar to the pads and within the active area. In these embodiments, the wires are to be shielded by an upper shielding layer to ensure that they will not affect the measurement. The structure of the sensing surfaces of the following figures enables enlarging the (vertical) size of the sensing surface, while minimizing the number of layers forming the sensing surface.

Figure 8:
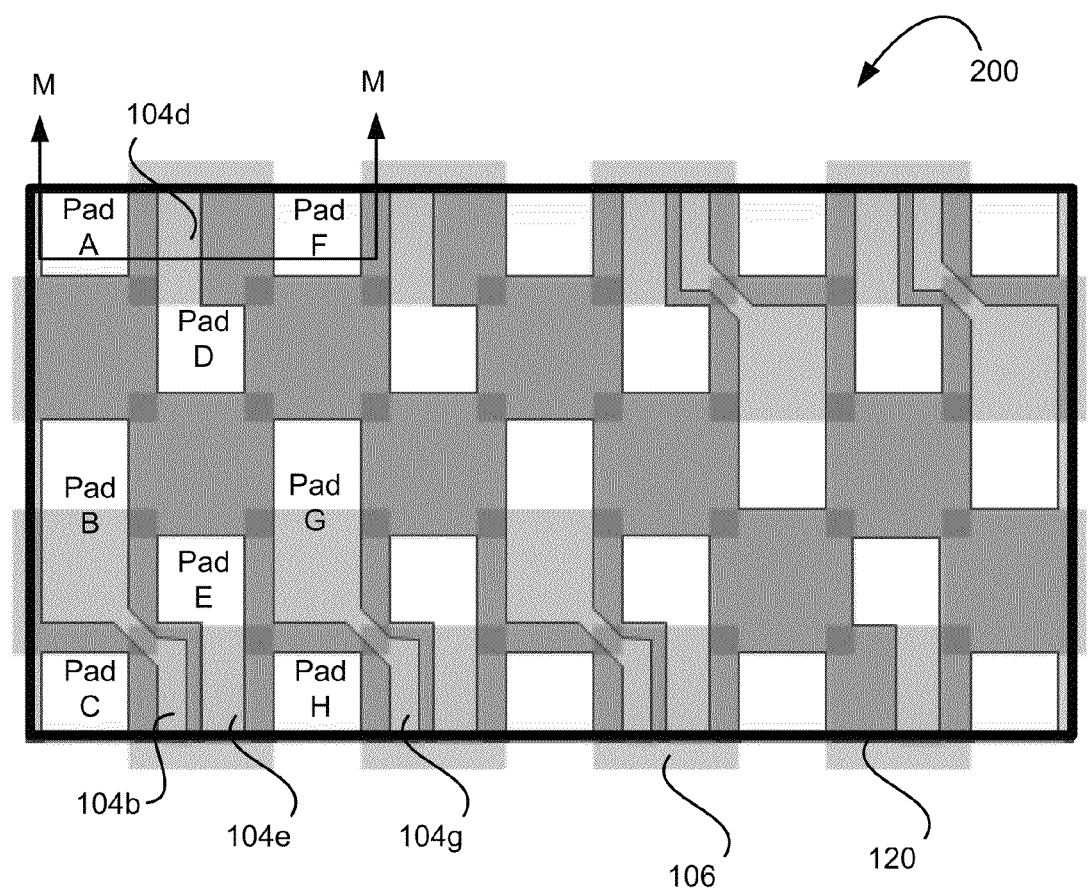
FIG. 8 is a schematic drawing illustrating an example of a pattern and geometry of the pads according to a sensing surface of the present invention, in which five horizontal lines of pads are present and the pads either contact the border of the sensing surface or are connected to the border of the sensing surface via wires which are on the same plane (i.e. same layer) as the pads, and in which the wires are shielded by a transparent shielding element.

In FIG. 8, a schematic drawing illustrating an example of a pattern and geometry of the pads according to a sensing surface of the present invention, in which five horizontal lines of pads are present and the pads either contact the border of the sensing surface or are connected to the border of the sensing surface via wires which are on the same layer as the pads. The sensing surface 200 of FIG. 8 can be used as part of a touch/proximity sensor which has a diagonal of about 4 inches, and is made of transparent material.

In the general art, the size of the pads is maximized, so that the distance between pads is minimized, and so that the self-capacitance effect is increased. However, in the sensing surface 200 of the example of FIG. 8 (and in the examples of FIGS. 11a-11b and 12), the size of the pads is decreased as compared to the size of the pads of a sensor of the general art. The decreased size of the pads gives rise to some pad-less regions (empty space between the pads), so that paths between some pads and the sensing surface's edge can be created. These paths can be traced by wires made of transparent material, to connect the pads to the sensing surface's edge (perimeter).

The pads A, C, F, and H are in contact with the edge 120 of the sensing surface 200. The pads B, D, E, and G are connected to the edge 120 (and thus to leads leading to the electric circuit(s)) via the wires 104b, 104d, 104e, and 104g, respectively. The wires are traced on respective paths along the sensing surface 200, between the respective pads and the edge of the surface (i.e., passing over the active area). The sensing surface 200 is designed so that these paths (and thus the wires) do not cross each other or any other pad. It should be noted that the wires and the pads of the sensing surface 200 of the present invention lie on the same layer (are coplanar) which reduces the number of layers and eliminates the need for "vias". In contrast, in sensing surfaces shown in the embodiments of FIGS. 1-2, the pads and wires lie on different layers. The surface 200 also comprises an upper shielding layer 106 to shield the wires. The upper shielding layer is designed to have apertures for leaving the pads exposed, and thus enabling proximity/touch sensing. As described above, the shielding of the wires is required in order to receive a capacitive image from the sensor which is composed of measurements which are effected almost solely by the self-capacitance effect between the one or more objects and the sensing pads.

Because of the decreased size of the pads in the sensing surface 200, the capacitance between an object (e.g. finger) and any given pad is lowered. Thus the voltage drop in the electric circuit due to the object's proximity is also lowered, decreasing the signal-to-noise ratio of the output signal and decreasing the distance at which the object is detected. This effect can be dealt with in at least one of two novel techniques. According to a first technique, the amplitude of the exciting signal is increased. Since the self-capacitance effect is in direct proportion to the exciting signal, the signal-to-noise ratio of the output signal increases, as does the distance at which the object can be detected. According to a second technique, the frequency of the exciting signal is increased which reduces the self-capacitance impedance and thus increases the measured voltage drop.

It should be noted that because the wires and the pads are coplanar, there is a tradeoff between the size of the pads on one hand, and the spacing between any of the conductive elements (wires and pads) on the pads layer and the width of the wire on the other hand. More specifically, the larger the pads are, the smaller the spacing, and/or the thinner the wires will be. The manufacturing of very thin wires and/or thin spaces between conductive elements made of transparent conductive material is problematic in terms of yield rate. On the other hand, decreasing the size of the pads in favor of the width of the wires would require an increase in the power to be injected into the pads in order to raise the signal-to-noise ratio of the output signal and the distance at which the object can be detected. Thus, suitable sizes of the pads and of the wires are to be chosen in order to ensure that the wires can be easily fabricated, while the power consumption of the sensing surface is not overly increased. For example the pads could be 10 mm×10 mm while the wires are 1 mm width and minimal spacing is also 1 mm.

It has been shown that the pattern of the pads of the sensing surface 200 enables the sensing surface 200 to be transparent and to be used in a 3D, multi-touch sensor, as explained above.

Figure 9A:
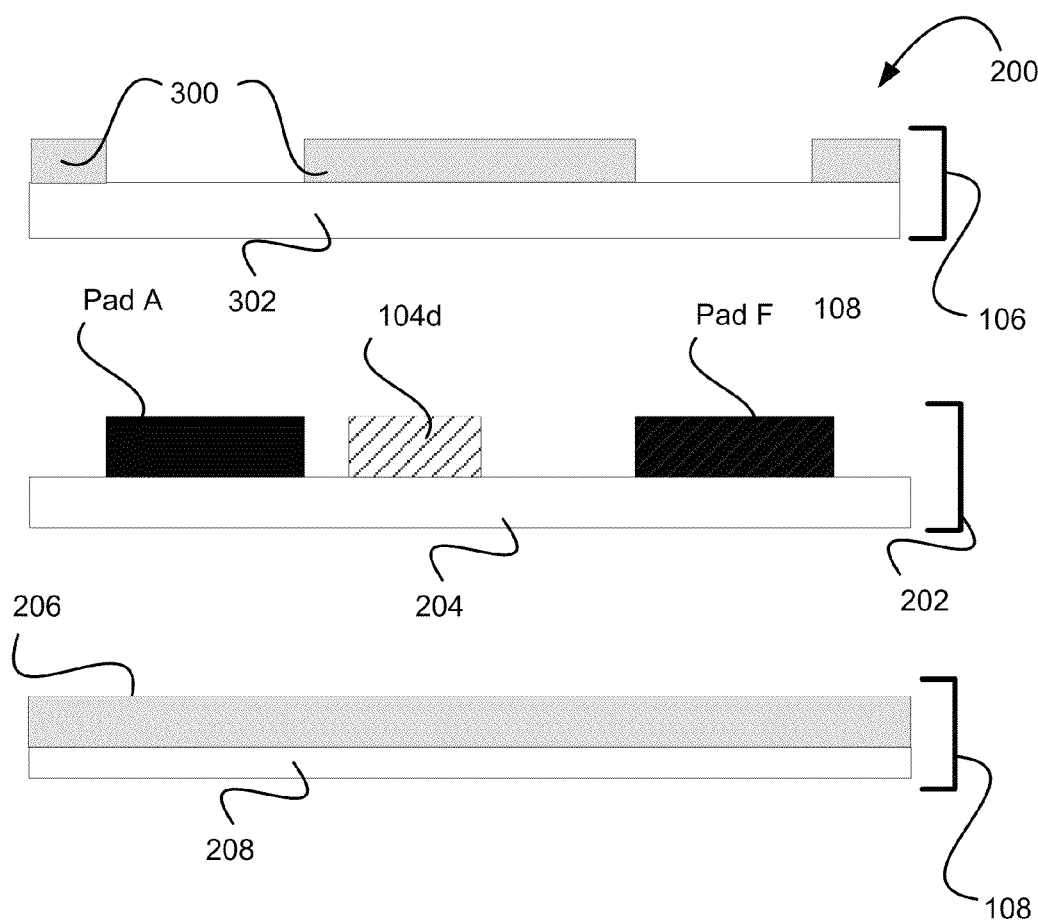
FIGS. 9a-9b are schematic drawings illustrating a lateral cross section of a sensing surface in which the pads either contact the border of the sensing surface or are connected to the border of the sensing surface via wires which are on the same layer as the pads.
Figure 9B:
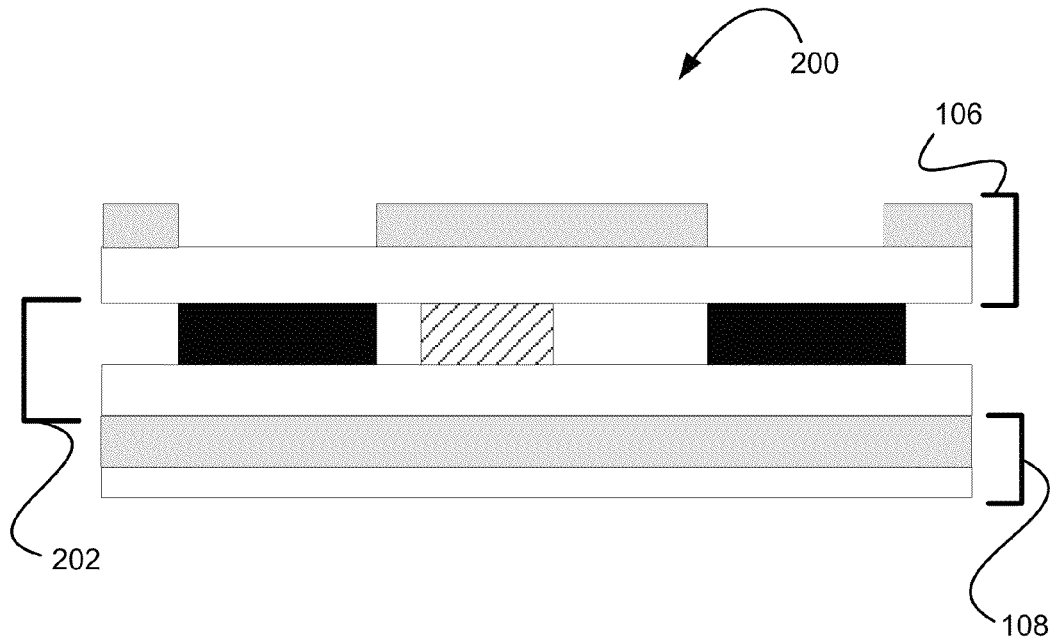

Referring now to FIGS. 9a-9b, lateral cross section MM of the sensing surface 200 of FIG. 8 is illustrated. The sensing surface in the example of FIGS. 9a-9b is the sensing surface 200 of FIG. 8. However, any sensing surface of the present invention in which the pads are joined to a border (edge) of the sensing surface via a wire located on the same layer as the pads can have the same structure illustrated in FIGS. 9a-9b.

The pads layer 202 includes the pads (e.g., the pads A and F) printed over a first insulating sheet 204. The bottom shielding layer 108 (if present) includes a first film of conductive material 206 printed upon a second insulating sheet 208. The top shielding layer 106 includes a second film of conductive material 300 printed upon a third insulating sheet 302. The second film 300 is printed according to a desired pattern, to cover the wires (and optionally to cover the pad-less regions between the pads), while leaving the pads exposed.

The bottom shielding layer shields the pads and wires from self-capacitance effect created by one or more objects located underneath the sensor and/or from noise sources located underneath the sensor.

As described above, when the sensor is overlaid on top of an LCD without bottom AC shielding layer, the parasitic capacitance between the LCD and the pad (and wire), attenuates the measurement of the self-capacitance effect between the object and the pad.

When the layers 202, 106, and 108 are brought together, the first film of conductive material 206 is in contact with the first insulating sheet 204, while the pads and wires are in contact with the third insulating sheet 302. In this manner, the pads and wires are insulated from the conductive material 206 and 300 of the first and second shielding layers. It should be noted that the term "in contact" includes the option of using intermediate layer as glue.

The pads, wires and conductive film of the shielding layers may be made of any non-transparent material. The first second and third insulating films may be made of polyester PET film.

Figure 10A:
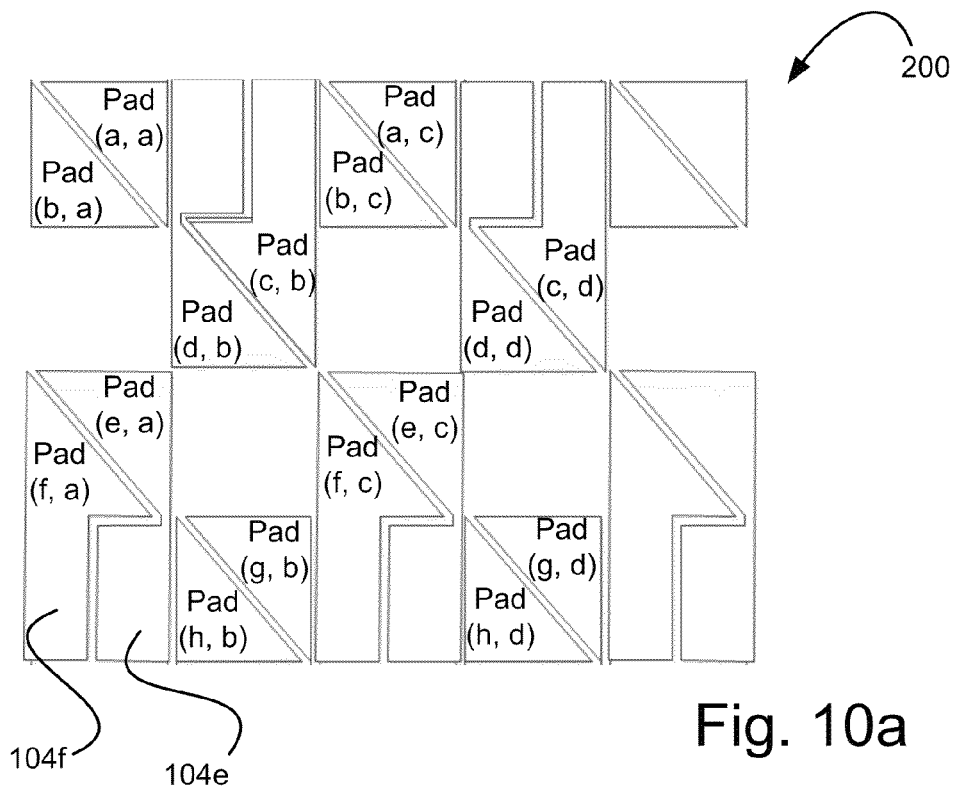
FIGS. 10a-10b are schematic drawing illustrating an example of a pattern and geometry of the pads according to a sensing surface of the present invention, in which a checkered pattern of four rows sensing elements is present, each sensing element including two pads spaced apart from each other, the pads either contact the border of the sensing surface or are connected to the border of the sensing surface via wires which are on the same layer as the pads, and in which the wires are shielded by transparent shielding element.
Figure 10B:
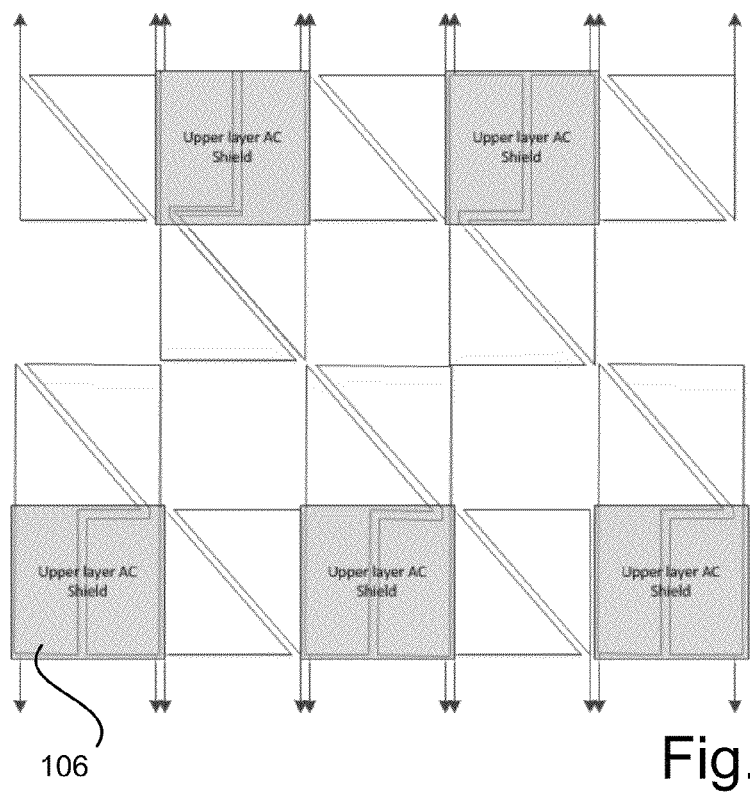

Referring now to FIGS. 10a-10b are schematic drawings illustrating another example of a different configuration of the pads, in which a checkered pattern of sensing elements includes four rows of sensing elements, each element including two pads spaced apart from each other. It should be noted that the term "checkered" relates to the pattern in which the pads are arranged like a checkers game. The pads either contact the border of the sensing surface 200 or are connected to the border of the sensing surface via transparent wires which are on the same layer as the pads. The novel configuration of the sensing surface 200 of FIGS. 10a-10b enables the use of this surface as a part of a touch/proximity sensor which has a diagonal of about 8 inches.

In this example, a first row includes the pads (a, a), (b, a), (b, c) and (a, c). In this row, a first element includes the pads (a, a) and (b, a), while a second element includes the pads (b, c) and (a, c). A pad-less region separates the first and second elements, such that the length of the pad-less region equals to the length of a sensing element. The row below the first row includes sensing elements as described above, such that the sensing elements are located under the pad-less regions of the first row. In this manner, the checkered pattern is achieved.

Similarly to the sensing surfaces described above, in the sensing surface 200, the pads and wires are located on the same layer. At least some of the pads reach the edge of the sensing surface 200 via respective wires. The pads are not in contact with each other and are printed on an insulating sheet, and are thus isolated from each other on the sensing surface. No wire crosses or contacts any other wire or any pad except for its respective pad.

As explained above, the wires (e.g., 104e and 104f) are to be covered by a shielding layer, in order to preserve the signals propagating along the wires from being influenced by the self-capacitance effect between the wires and an object. The pattern of the upper shielding layer 106 is shown in FIG. 10b. Optionally, the shielding layer shields also the pad-less and wire-less regions between pads.

Since the wire and pads are co-planar, the need for "vias" is obviated in this sensor and thus it can be used as transparent 3D multi-touch sensor as explained above.

Figure 11A:
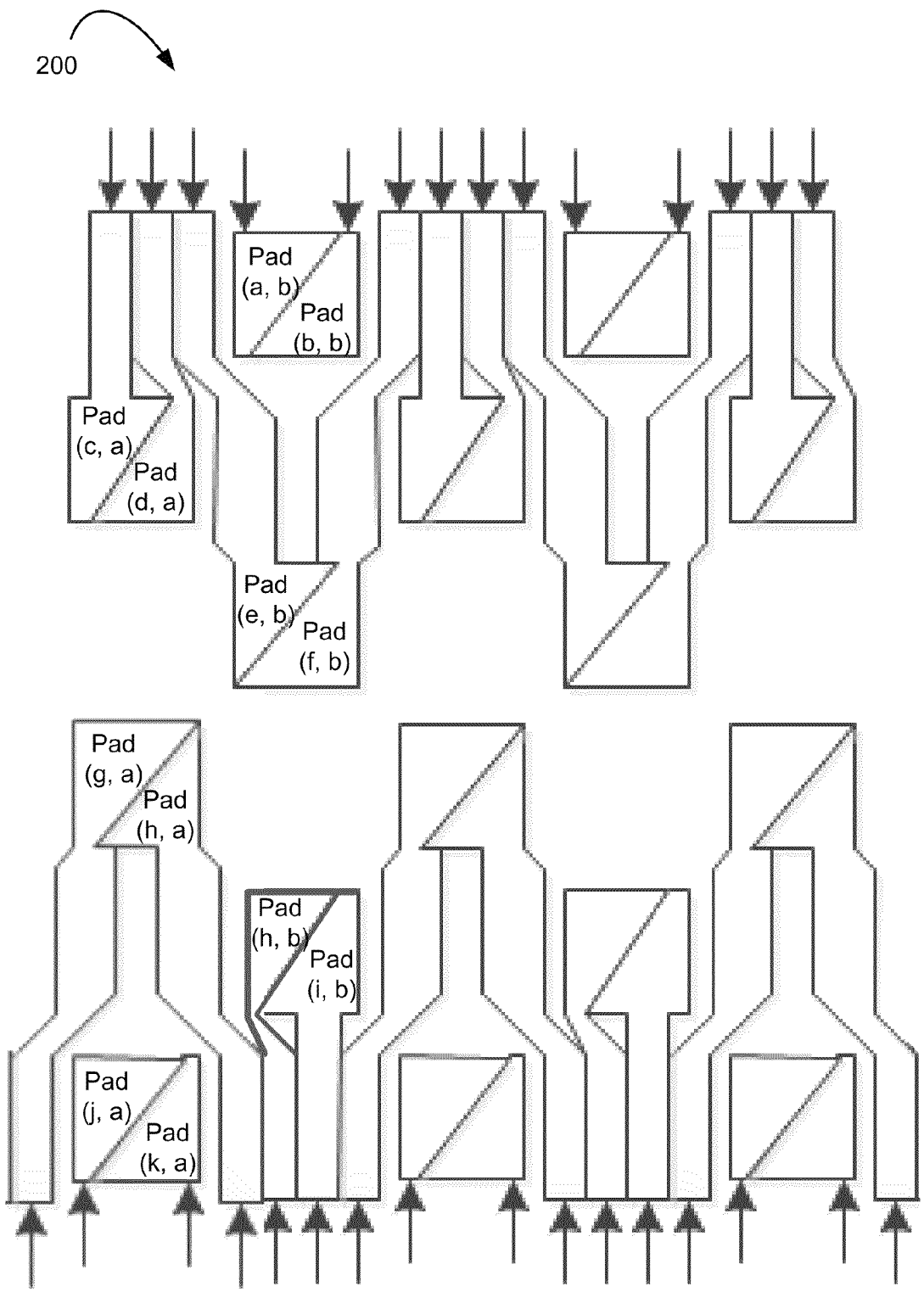
FIGS. 11a-11b are schematic drawings illustrating an example of a pattern and geometry of the pads according to a sensing surface of the present invention, in which a checkered pattern of six rows sensing elements is present, each sensing element including two pads spaced apart from each other, the pads either contact the border of the sensing surface or are connected to the border of the sensing surface via wires which are on the same layer as the pads, and in which the wires are shielded by a transparent shielding element.
Figure 11B:
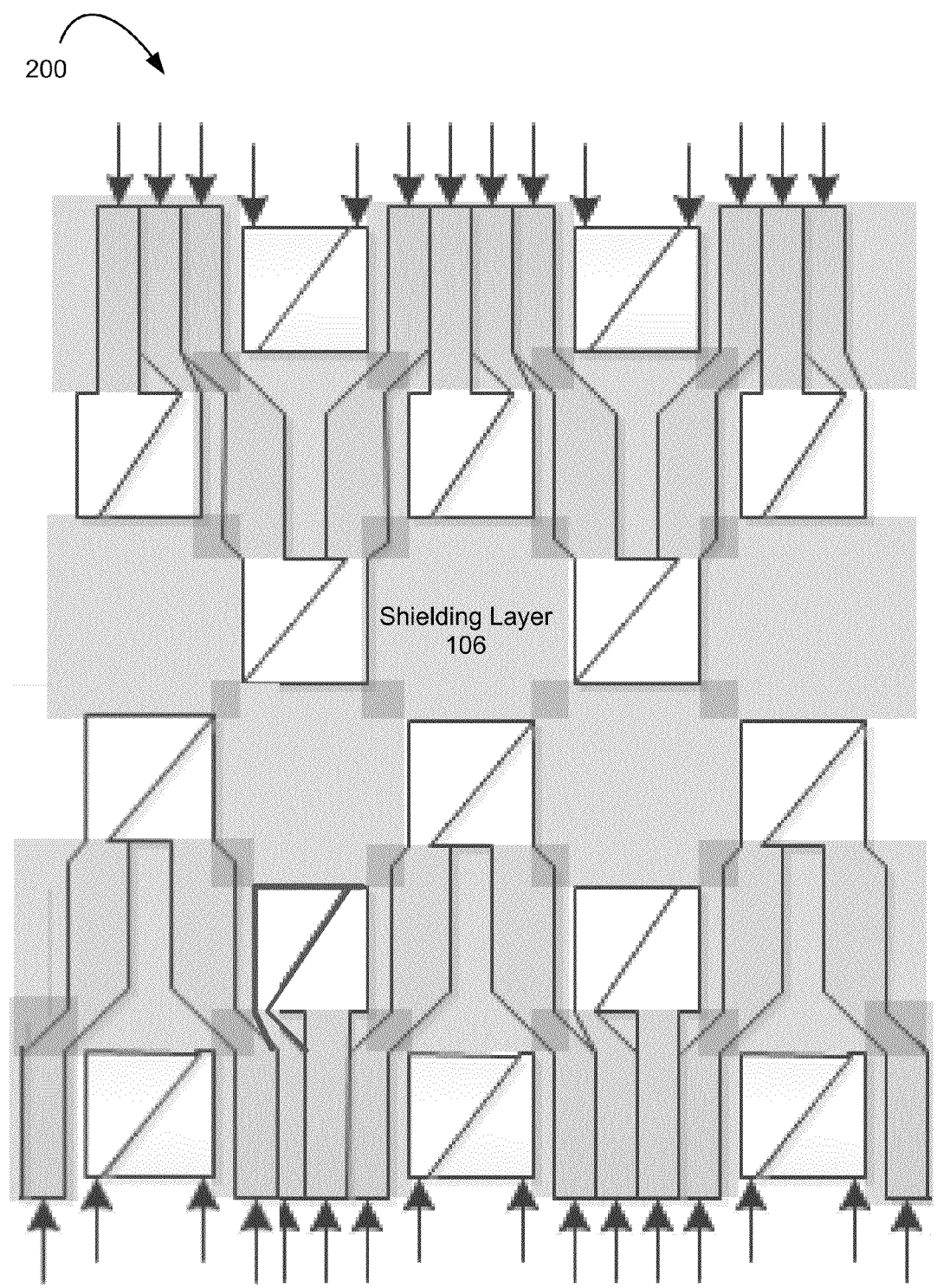

Referring now to FIGS. 11a-11b, schematic drawings illustrate another example of a pattern and geometry of the pads of the sensing surface according to the present invention, in which the pads either contact the border of the sensing surface 200 or are connected to the border of the sensing surface via wires which are on the same layer as the pads. The novel configuration sensing surface 200 enables the use of this surface to cover as part of a touch/proximity sensor covering a screen having a 15-inch diagonal (e.g. a screen of a common laptop computer).

In the example of FIGS. 11a and 11b, a checkered pattern of sensing elements arranged in six rows can be found. Like the example of FIGS. 10a and 10b, each sensing element includes two sensing pads spaced apart from each other. The size of the pads relative to the size of the sensing surface is decreased, as compared to the relative size between the pads and sensing surface of FIGS. 10a and 10b. This enables the creation of pad-less regions that can be traversed by wires connecting some of the pads to the edge of the sensing surface. In order to compensate for the size decrease of the pads, the exciting voltage may be increased and/or its frequency may be increased.

As was the case with the sensing surface of FIGS. 8, and 10a-10b, in the sensing surface 200 of FIGS. 11a-11b, the pads that do not directly contact the boundaries of the sensing surface 200 are connected thereto by wires which are coplanar to the pads. The sensing surface 200 includes regions that are covered by pads and pad-less regions that may be covered by wire or may be empty. The pad-less regions are sided by at least two pads, and may be surrounded by three or four pads.

The wires are to be covered by an upper shielding layer 106, which has a pattern designed to leave the pads exposed, as shown in FIG. 11b. Optionally, at least some of the pad-less and wire-less regions between pads are covered by the upper shielding layer 106.

Since the wire and pads are co-planar, the need for "vias" is obviated in this sensor and thus it can be used as transparent 3D multi-touch sensor as explained above.

The pads of FIGS. 10a-10b and 11a-11b are shown to be triangular, but may assume any geometrical form, as explained in the description of FIGS. 3b-3c. Moreover, lateral cross sections of the sensing surface of FIGS. 10a-10b and 11a-11b have the structure described in FIGS. 9a-9b.

Figure 12:
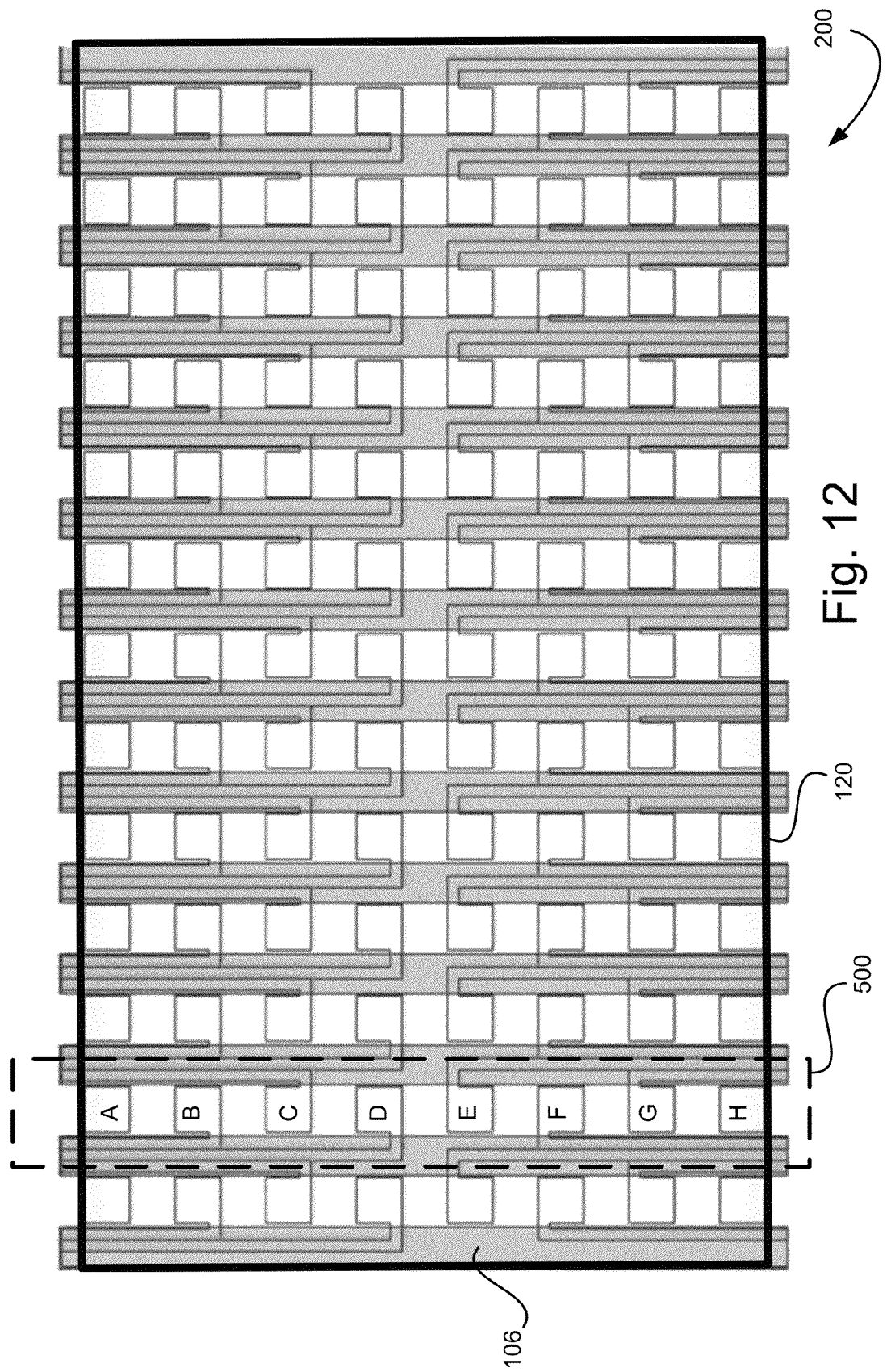
FIG. 12 is a schematic drawing illustrating an example of a pattern and geometry of the pads according to a sensing surface of the present invention, in which the pads are arranged in spaced-apart vertical lines and wires connecting pads to the border of the sensing surface are located in the spaces between the vertical lines and are shielded by a transparent shielding element.

FIG. 12 is a schematic drawing illustrating an example of another configuration of the sensing surface of the present invention, in which the pads are arranged in spaced-apart vertical lines and wires connecting pads to the border of the sensing surface are located in the spaces between the vertical lines.

The sensing surface 200 can have any desired number of pads in the same vertical line, as long as the spacing between vertical lines enables the passage of the wires therethrough, without the co-planar wires crossing or touching each other.

In the example of FIG. 12, a given vertical line 500 includes eight pads. The outer pads A and H are in contact with the edge 120 of the sensing surface 200. The inner pads B-G are connected to the edge 120 via respective wires traced in the spaces between the vertical line 500 and the nearby vertical lines of pads. The spaces between vertical lines are covered by an upper shielding layer 106 in order to decrease or eliminate the self-capacitance effects on the wires created by the proximity of an object.

The spacing between the vertical lines should be large enough to enable the wires of desired widths to travel therethrough. The spacing between horizontal lines of pads can be chosen as desired. Though the example of FIG. 12 depicts the distance between horizontal lines of pads and vertical lines of pads to be substantially equal, this is not a requirement, and the horizontal lines may be selected to be closer or farther from each other. Expanding the self-capacitance pads in a way that shrinks the spacing between horizontal lines might strengthen the self-capacitance effect as the area of the "object-pad" capacitor increases.

As explained above, the wire paths are created by a decrease in the size of the pads. In order to compensate for the size decrease of the pads, the exciting voltage may be increased and/or its frequency may be increased.

Since the wire and pads are co-planar, the need for "vias" is obviated in this sensor and thus it can be used as transparent 3D multi-touch sensor as explained above.

It should be noticed that the scope of the present invention includes capacitive sensors having the sensing surface 200 as described above, connected to an electrical circuit and a measurement unit (as known in the art). Optionally, each pad is connected to a respective electrical circuit and measurement unit. Alternatively, at least some of the pads are in a group connected to the same electrical circuit and measurement unit. In the latter case, the sensor may include a switching unit, which is configured for transmitting the exciting signal to each pad of the group consecutively. In a variant, the group includes all the pads of the sensing surface. In another variant, the pads are divided into a plurality of groups, and each group is connected to a respective electric circuit and measurement unit.

Figure 13:
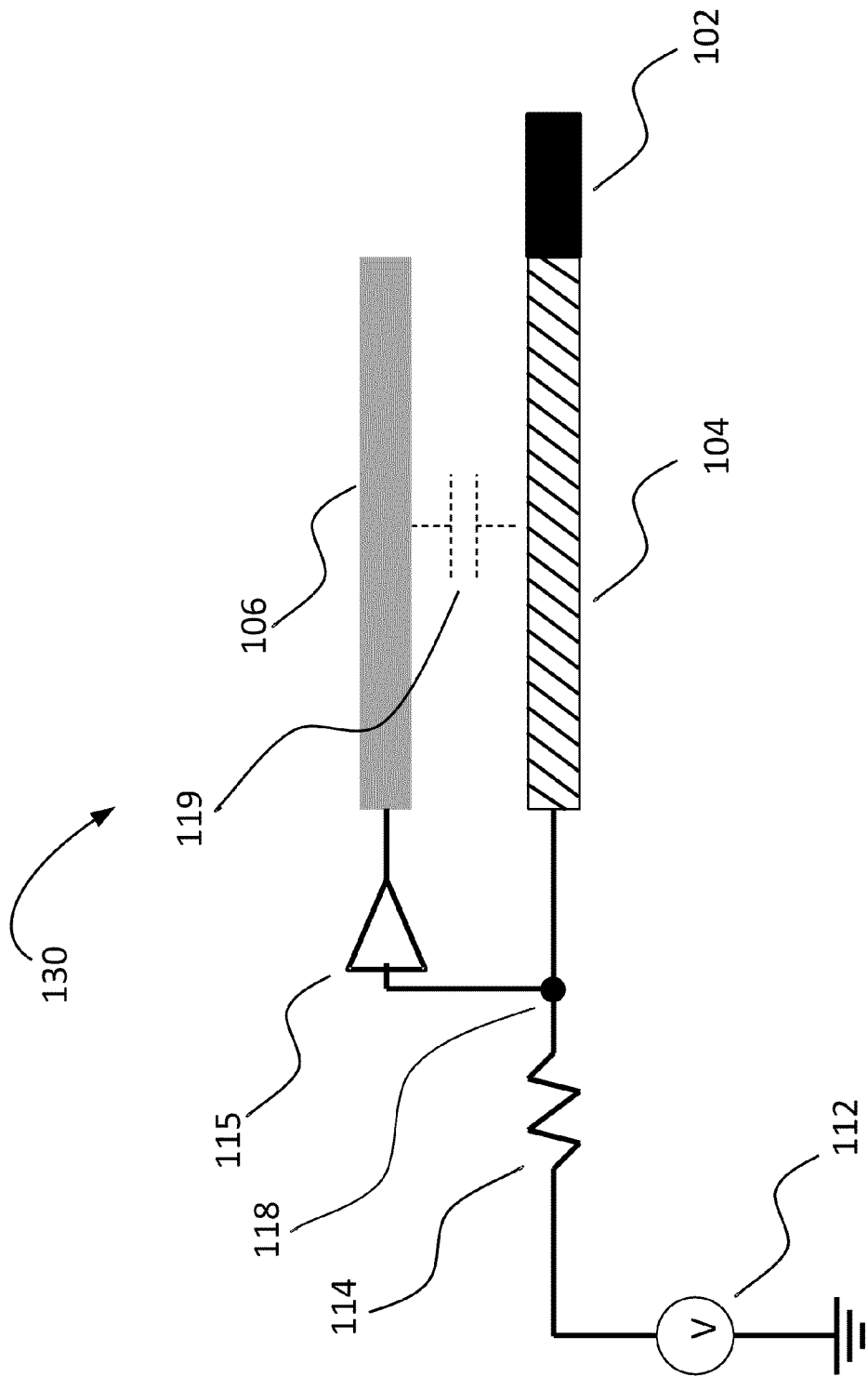
FIG. 13 is a schematic drawing illustrating an electronic circuit which may be incorporated into a transparent shielding element of the sensing surface of the present invention.

According to one broad aspect of the present invention, there is provided an upper/top shielding layer, electrically insulated from the pads and the wires layer. The upper shielding layer comprises one or more conductive elements which cover the wires in order to shield the wires from self-capacitance effects that may be caused by the proximity of one or more objects to the wires. In this connection, reference is now made to FIG. 13 representing an electrical circuit 130 which may be included in the sensing surface of the present invention. The electrical circuit 130 may be incorporated to the top shielding layer 106 illustrated, for example, in FIGS. 8-12. The shielding signal outputted from the electrical circuit 130 changes dynamically according to the self-capacitance effect between the object and the pad. The electrical circuit 130 includes a self-capacitance circuit as described for example in FIG. 1 comprising an excitation source 112, a resistor 114, a pad 102 and a wire 104 connecting the pad 102 to the sensor surface edge. In this aspect of the present invention, the potential applied to the top shielding layer 106 is not predetermined but changes according to a voltage drop occurring at junction 118. The dynamic variation of the potential enables to further minimize the potential difference between the AC shield layer (s) 106 and wire 104, and thus minimize the effect of the (parasitic) capacitance 119 created between the AC shield 106 and the wire 104 on the measured voltage at junction 118. Otherwise, if the potential applied to the shielding layer 106 is predetermined, the parasitic capacitance 119 would pull the measured voltage at junction 118 towards the predetermined potential of the shielding layer 106 and the self-capacitance effect between the object and the pad 102 on the measured voltage at junction 118 would be reduced as well as the signal-to-noise ratio of the measurement. The bigger the parasitic capacitance 119 is, the bigger the pull towards the potential of the shielding layer 106. It is desired, therefore, that the potential of shielding layer 106 would be close to the potential of the wire 104 in order to reduce the effect of the parasitic capacitance 119 on the measurement. If a bottom shielding layer 108 is present (as was illustrated in FIGS. 6a-6b, 9a-9b), a similar adaptive potential method can be applied to a bottom shielding layer 108 in order to minimize the parasitic capacitance effect between the bottom shielding layer 108 and the bottom side of the wire 104 connected to the pad 102 on the measured voltage at junction 118 and to minimize the parasitic capacitance effect between the bottom shielding layer 108 and the bottom side of the pad 102 on the measured voltage at junction 118. The implementation of such adaptive shielding potential can be done, for example, by using an amplifier 115 electrically connectable in between the electric shielding layer(s) 106 and the wire 104.

The amplifier 115 may be an operational amplifier configured as a unity gain buffer and operable as a voltage follower. The output of the buffer is electrically connected to the electric shielding layer 106 and the input of the buffer is electrically connected to the wire 104. The input impedance of buffer 115 is high (for example 10TΩ) and therefore its load on junction 118 is negligible as well as its influence on the measured voltage at junction 118. The low impedance output of the buffer 115, which is applied to shielding layer 106, is substantially the same as the measured voltage at junction 118 regardless to the load that may be added by one or more objects above shielding layer 106. The result is that the potential difference on parasitic capacitance 119 is close to zero and the measured voltage at junction 118 is mainly affected by the self-capacitance effect between the finger and pad 102. Though explained for a self-capacitance method which is based on voltage divider between a resistor and a pad-finger capacitor, this adaptive shielding method can be applied for other self-capacitance circuits.

In a non-limiting example, the width of the transparent wire 104 may be about 0.7 mm, the length of the wire 104 may be about 30 mm, the distance between the shielding layer 106 and the wire 104 may be about 0.1 mm, the relative permittivity for the insulating sheet 302 may be about 2.8, and therefore the parasitic capacitance 119 may be about 5 pF.

For example, a hovering finger having an overlapping area of about 100 mm$^2$ over the sensing pad 102 at a hover height of about 20 mm creates a capacitance of about 50 fF (smaller by factor of 100 than the parasitic capacitance 119). By using the adaptive shielding potential method of the present invention and by assuming that the resistor 114 has a resistance of about 6MΩ and the excitation source 112 supplies a signal having a sine wave with an amplitude of about 3V and a frequency of about 200 kHz, the voltage drop at junction 118, due to the self-capacitance effect between the finger and the pad 102, will be about 200 mV. When a (predetermined) excitation voltage 112 is applied to the shielding layer 106, as explained in reference to FIG. 1b, the voltage drop at junction 118, due to the self-capacitance effect between the finger and pad 102 is only 40 mV. When the shielding layer 106 is grounded, the voltage drop at junction 118, due to the self-capacitance effect between the finger and pad 102, is less than 1 mV. Therefore, when analyzing the influence of hovering fingers, the SNR of the adaptive shielding potential method of the present invention is better by factor of 5 as compared to other predetermined potential shielding methods. Therefore, the adaptive shielding method of the present invention enables to detect an object located at a greater hover distance from the pad than conventional methods.

As described above, in some embodiments, several wires and/or pads are connected to the input of one buffer via a switch (not shown). In some embodiments, the shield layer(s) 106 and/or 108 may be applied with a predetermined shielding signal. In some embodiments, the shield layer(s) 106 and/or 108 may be applied with a predetermined DC voltage.

Alternatively or additionally, the shield layer(s) 106 and/or 108 may be grounded. In some embodiments, the shield layer(s) 106 and/or 108 may be applied with predetermined AC voltage.

The invention claimed is:

1. A sensing surface for providing measured data indicative of a three-dimensional behavior of one or more objects thereover, comprising:
   an edge, at the periphery of the sensing surface, through which the sensing surface can be connected to electrical circuitry;
   a pads layer, in the area within said edge, comprising an insulating sheet and a plurality of sensing pads overlaying said insulating sheet, the sensing pads being arranged on said insulating sheet in a pattern configured such that each such sensing pad is isolated from one another and there is an electrical connection between each said sensing pad of said pattern and said edge, wherein at least some of said sensing pads are connected to said edge by means of a respective wire; and
   an upper shielding layer, in the area within said edge, comprising a conductive material isolated from but overlaying said wires, said upper shielding layer being capable of shielding the wires over which it lays from electrical effects that may be caused by proximity of the one or more objects to said wire when in use.

2. The sensing surface of claim 1, comprising a lower shielding layer located under said insulating sheet, said lower shielding layer comprising a film of conductive material.

3. The sensing surface of claim 1, wherein all of the components of said sensing surface, other than said edge, are made of a transparent material.

4. The sensing surface of claim 1, wherein the pattern in which said sensing pads are arranged on said insulating sheet comprises an arrangement of spaced-apart sensing pads such that at least two spaced-apart sensing pads flank a sensing pad-less region, the sensing pad-less region being a region without sensing pad or a region through which one or more of said wires pass.

5. The sensing surface of claim 1, wherein said sensing pads are arranged in groups, each sensing pad belonging to one of the groups having a geometrical shape chosen such that the sensing pads of the groups form a desired shaped perimeter.

6. The sensing surface of claim 1, wherein the pattern in which said sensing pads are arranged on said insulating sheet is a checkered pattern.

7. The sensing surface of claim 1, wherein said sensing pads are arranged in spaced-apart parallel lines, and said wires are located in the spacings between the parallel lines.

8. The sensing surface of claim 7, wherein said upper shielding layer overlays each of said spacings between the parallel lines of sensing pads.

9. The sensing surface of claim 1, wherein all of said sensing pads and said wires are coplanar.

10. The sensing surface of claim 1, wherein a second insulating sheet is placed in-between the pads layer and the conductive material of the upper shielding layer.

11. The sensing surface of claim 1, wherein each said sensing pad is a self-capacitance sensing pad.

12. The sensing surface of claim 1, wherein said upper shielding layer also overlays a part of said sensing pads but leaving at least a part of each said sensing pad exposed.

13. The sensing surface of claim 1, wherein some of said sensing pads are electrically connected directly to said edge.

* * * * *